US012588367B2

(12) United States Patent
Hao et al.

(10) Patent No.: US 12,588,367 B2
(45) Date of Patent: Mar. 24, 2026

(54) METHOD FOR PREPARING ORGANIC LIGHT-EMITTING DISPLAY PANEL, ORGANIC LIGHT-EMITTING DISPLAY PANEL, AND DISPLAY DEVICE

(71) Applicant: BOE Technology Group Co., Ltd., Beijing (CN)

(72) Inventors: Yanjun Hao, Beijing (CN); Caiyu Qu, Beijing (CN); Xiaobo Du, Beijing (CN); Yansong Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 605 days.

(21) Appl. No.: 17/921,636

(22) PCT Filed: Aug. 4, 2021

(86) PCT No.: PCT/CN2021/110541
§ 371 (c)(1),
(2) Date: Oct. 27, 2022

(87) PCT Pub. No.: WO2022/062689
PCT Pub. Date: Mar. 31, 2022

(65) Prior Publication Data
US 2023/0172002 A1 Jun. 1, 2023

(30) Foreign Application Priority Data
Sep. 24, 2020 (CN) .......................... 202011013883.1

(51) Int. Cl.
*H10K 59/122* (2023.01)
*H10K 59/12* (2023.01)
*H10K 59/35* (2023.01)

(52) U.S. Cl.
CPC ....... *H10K 59/122* (2023.02); *H10K 59/1201* (2023.02); *H10K 59/352* (2023.02)

(58) Field of Classification Search
CPC ............. H10K 59/122; H10K 59/1201; H10K 59/352; H10K 59/123; H10K 59/124
(Continued)

(56) References Cited

U.S. PATENT DOCUMENTS

2009/0009069 A1* 1/2009 Takata ................. H10K 50/824
445/24
2016/0300894 A1* 10/2016 Park ..................... H10K 59/124
(Continued)

FOREIGN PATENT DOCUMENTS

CN 107731883 A 2/2018
CN 108630729 A 10/2018
(Continued)

OTHER PUBLICATIONS

International Search Report for PCT/CN2021/110541 Mailed Nov. 3, 2021.

*Primary Examiner* — Dzung Tran
(74) *Attorney, Agent, or Firm* — Ling Wu; Stephen Yang; Ling and Yang Intellectual Property

(57) ABSTRACT

Provided are a method for preparing an organic light-emitting display panel, an organic light-emitting display panel, and a display device. The method comprises: forming a pixel defining layer on one side of a substrate; forming a pixel supporting layer on the side of the pixel defining layer away from the substrate, and causing the orthographic projection of the surface of the pixel supporting layer that faces the pixel defining layer on the substrate to be within the range of the orthographic projection of the side surface of the pixel supporting layer away from the pixel defining layer on the substrate; forming a light-emitting functional layer on the side of the pixel supporting layer away from the pixel defining layer; and removing the pixel supporting layer to obtain an organic light-emitting display panel.

15 Claims, 5 Drawing Sheets

First direction

(58) Field of Classification Search
    USPC ........................................................ 257/40
    See application file for complete search history.

(56)                  References Cited

U.S. PATENT DOCUMENTS

| 2016/0300897 A1* | 10/2016 | Song | H10K 71/40 |
| 2017/0186831 A1* | 6/2017 | Nam | H10K 59/1213 |
| 2019/0036047 A1* | 1/2019 | Zhou | H10K 59/124 |
| 2019/0067390 A1 | 2/2019 | Gao | |
| 2019/0363279 A1* | 11/2019 | Yamaguchi | H10K 50/814 |
| 2020/0083489 A1 | 3/2020 | Fang et al. | |
| 2020/0279897 A1* | 9/2020 | Nendai | H10K 50/81 |

FOREIGN PATENT DOCUMENTS

| CN | 111668272 A | 9/2020 |
| CN | 112002833 A | 11/2020 |

* cited by examiner (a)

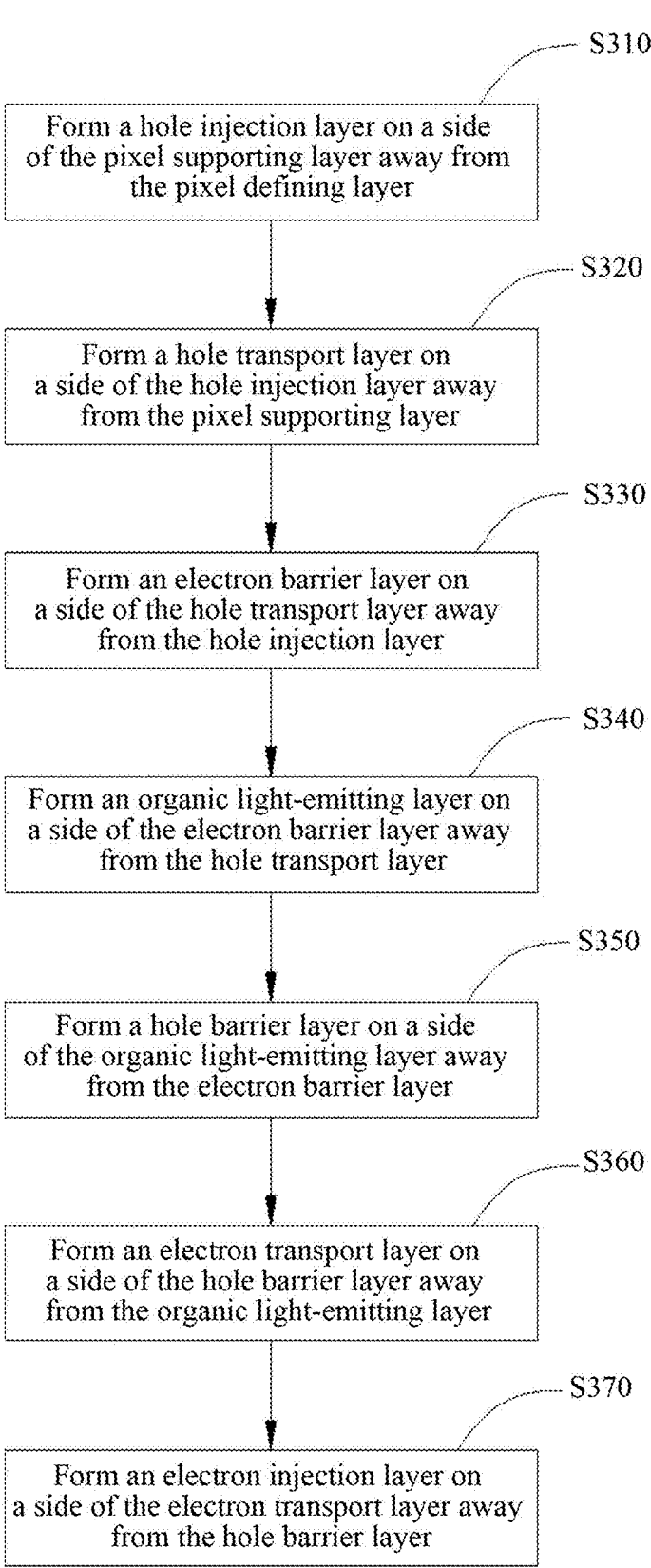

S310

Form a hole injection layer on a side
of the pixel supporting layer away from
the pixel defining layer

S320

Form a hole transport layer on
a side of the hole injection layer away
from the pixel supporting layer

S330

Form an electron barrier layer on
a side of the hole transport layer away
from the hole injection layer

S340

Form an organic light-emitting layer on
a side of the electron barrier layer away
from the hole transport layer

S350

Form a hole barrier layer on a side
of the organic light-emitting layer away
from the electron barrier layer

S360

Form an electron transport layer on
a side of the hole barrier layer away
from the organic light-emitting layer

S370

Form an electron injection layer on
a side of the electron transport layer away
from the hole barrier layer

FIG. 4

First direction

Second direction

First direction

Second direction

METHOD FOR PREPARING ORGANIC LIGHT-EMITTING DISPLAY PANEL, ORGANIC LIGHT-EMITTING DISPLAY PANEL, AND DISPLAY DEVICE

CROSS-REFERENCE TO RELATED APPLICATIONS

The present application is a U.S. National Phase Entry of International Application No. PCT/CN2021/110541 having an international filing date of Aug. 4, 2021, which claims priority to Chinese Patent Application No. 202011013883.1 entitled "Method for Preparing Organic Light-emitting Display Panel, Organic Light-emitting Display Panel, and Display Device" and filed to the CNIPA on Sep. 24, 2020. The above-identified applications are incorporated into this application by reference in their entirety.

TECHNICAL FIELD

The present application relates to the display field, in particular to a method for preparing an organic light-emitting display panel, an organic light-emitting display panel and a display device.

BACKGROUND

With people's increasing requirements for the display effect of electronic devices, organic light-emitting display panels have become the main research and development direction in the display field because of their characteristics of self-luminescence, wide viewing angle, wide color gamut, high contrast, thinness, foldability, bendability, thinness and portability. However, the current organic light-emitting diodes are prone to low gray scale crosstalk in practical applications, which affects the display effect of the panel.

Therefore, the current method for preparing an organic light-emitting display panel, the current organic light-emitting display panel and the current display device still need to be improved.

SUMMARY

The present application is based on the inventor's study on the following problems.

The inventor found that in order to perform color display, a plurality of organic light-emitting diodes of different colors, such as red, green and blue (hereinafter referred to as R, G and B), are provided on an organic light-emitting display substrate. When a switch-on voltage is applied to the organic light-emitting diode of one color among the organic light-emitting diodes of RGB, it is easy to light up the organic light-emitting diodes of the other colors, especially in low gray scale, which is identified as low gray scale crosstalk, and thus the panel display effect is affected negatively.

The present application is intended to solve one of the technical problems in the related art to some extent.

In one aspect of the present application, the present application provides a method for preparing an organic light-emitting display panel, including: forming a pixel defining layer on a side of a substrate; forming a pixel supporting layer on a side of the pixel defining layer away from the substrate, wherein an orthographic projection of a surface of a side of the pixel supporting layer that faces the pixel defining layer on the substrate is within a range of an orthographic projection of a surface of a side of the pixel supporting layer away from the pixel defining layer on the substrate; forming a light-emitting functional layer on the side of the pixel supporting layer away from the pixel defining layer; and peeling off the pixel supporting layer to obtain the organic light-emitting display panel. Therefore, a disconnection slit is formed on the light-emitting functional layer by peeling off the pixel supporting layer, and the transverse transmission of carriers between adjacent organic light-emitting diodes is cut off, thus effectively improving the low gray scale display quality of the panel.

According to an embodiment of the present application, the pixel defining layer defines a plurality of sub-pixels on the substrate, the sub-pixels include a red sub-pixel, a blue sub-pixel and a green sub-pixel, and an orthographic projection of the pixel supporting layer on the substrate at least surrounds an area where the red sub-pixel is located. Therefore, by surrounding the red sub-pixel by the pixel supporting layer, the transverse transmission path of the carriers between the red sub-pixel and each of the green and blue sub-pixels can be cut off after the pixel supporting layer is peeled off.

According to an embodiment of the present application, the orthographic projection of the pixel supporting layer on the substrate separates areas where the red sub-pixel, the green sub-pixel and the blue sub-pixel are located from one another. Therefore, by surrounding the red sub-pixel, the green sub-pixel and the blue sub-pixel by the pixel supporting layer, the transverse transmission path of the carriers between RGB sub-pixels can be cut off after the pixel supporting layer is peeled off.

According to an embodiment of the present application, the pixel supporting layer is formed of a negative photosensitive material, and the negative photosensitive material includes a fluoroether material. The peeling off the pixel supporting layer includes: placing the substrate including the pixel defining layer, the pixel supporting layer and the light emitting functional layer in a peeling liquid, and a material forming the peeling liquid includes a fluoroether material, which is thereby beneficial to peel off the pixel supporting layer.

According to an embodiment of the present application, the light-emitting functional layer is a hole injection layer, a hole transport layer, an electron barrier layer, an organic light-emitting layer, a hole barrier layer and an electron transport layer. After peeling off the pixel defining layer, the method further includes: forming an electron injection layer on a side of the electron transport layer away from the hole barrier layer. Therefore, it is helpful to further improve the display effect.

According to an embodiment of the present application, the light-emitting functional layer is a hole injection layer and a hole transport layer. After peeling off the pixel defining layer, the method further includes: forming an electron barrier layer on a side of the hole transport layer away from the hole injection layer; forming an organic light-emitting layer on a side of the electron barrier layer away from the hole transport layer; forming a hole barrier layer on a side of the organic light-emitting layer away from the electron barrier layer; forming an electron transport layer on a side of the hole barrier layer away from the organic light-emitting layer; and forming an electron injection layer on a side of the electron transport layer away from the hole barrier layer. Therefore, it is helpful to further improve the display effect.

According to an embodiment of the present application, the light-emitting functional layer is a hole injection layer, a hole transport layer, an electron barrier layer and an organic light-emitting layer. After peeling off the pixel defining layer, the method further includes: forming a hole barrier layer on a side of the organic light-emitting layer away from the electron barrier layer; forming an electron transport layer on a side of the hole barrier layer away from the organic light-emitting layer; and forming an electron injection layer on a side of the electron transport layer away from the hole barrier layer. Therefore, it is helpful to further improve the display effect.

According to an embodiment of the present application, the light-emitting functional layer is a hole injection layer, a hole transport layer, an electron barrier layer, an organic light-emitting layer and a hole barrier layer. After peeling off the pixel defining layer, the method further includes: forming an electron transport layer on a side of the hole barrier layer away from the organic light-emitting layer; and forming an electron injection layer on a side of the electron transport layer away from the hole barrier layer. Therefore, it is helpful to further improve the display effect.

According to an embodiment of the present application, a thickness of the pixel supporting layer is 1 to 2 microns, which is thus beneficial to improve the effect of the pixel supporting layer supporting the mask.

According to an embodiment of the present application, a width of the pixel supporting layer is less than a width of a gap between two adjacent sub-pixels, which is thus helpful to further improve the display effect.

According to an embodiment of the present application, the width of the pixel supporting layer is 2 to 20 microns, which is thus helpful to further improve the display effect.

In another aspect of the present application, the present application provides an organic light-emitting display panel, including: a substrate; a pixel defining layer, defining a plurality of sub-pixels on the substrate; and a light-emitting functional layer, located on a side of the pixel defining layer away from the substrate; wherein the light-emitting functional layer is provided with a disconnection slit at a gap between two adjacent sub-pixels. Therefore, the low gray scale crosstalk between sub-pixels can be effectively reduced by the disconnection slit between adjacent sub-pixels in the light-emitting functional layer.

According to an embodiment of the present application, the sub-pixels include a red sub-pixel, a green sub-pixel and a blue sub-pixel, and an orthographic projection of the disconnected slit on the substrate surrounds an area where the red sub-pixel is located. Therefore, the low gray scale crosstalk between the red sub-pixels and other sub-pixels can be effectively reduced by the disconnection slit between the adjacent red sub-pixels in the light-emitting functional layer.

According to an embodiment of the present application, the orthographic projection of the disconnected slit on the substrate has a surrounding portion and a first connecting portion, wherein the surrounding portion surrounds the area where the red sub-pixel is located, and the first connecting portion connects two adjacent surrounding portions and separates the green sub-pixel and the blue sub-pixel that are located in a first direction and adjacent. Therefore, low gray scale crosstalk between adjacent red sub-pixels and between partial blue and green sub-pixels can be effectively reduced.

According to an embodiment of the present application, an orthographic projection of the disconnection slit on the substrate has the surrounding portion, the first connecting portion and a second connecting portion, wherein the first connecting portion connects two surrounding portions that are adjacent in a first direction, the first connecting portion separates areas in a second direction where the green sub-pixel and the blue sub-pixel are located, the second connecting portion connects two surrounding portions that are adjacent in the second direction, and the second connecting portion separates areas in the first direction where the green sub-pixel and the blue sub-pixel are located. Therefore, the low gray scale crosstalk between adjacent sub-pixels can be further effectively reduced.

According to an embodiment of the present application, the light-emitting functional layer is a hole injection layer, a hole transport layer, an electron barrier layer, an organic light-emitting layer, a hole barrier layer and an electron transport layer, and the organic light-emitting display panel further includes an electron injection layer. Therefore, the display effect can be further improved.

According to an embodiment of the present application, the light-emitting functional layer is a hole injection layer and a hole transport layer, and the organic light-emitting display panel further includes an electron barrier layer, an organic light-emitting layer, a hole barrier layer, an electron transport layer and an electron injection layer. Therefore, the display effect can be further improved.

According to an embodiment of the present application, the light-emitting functional layer is a hole injection layer, a hole transport layer, an electron barrier layer and an organic light-emitting layer, and the organic light-emitting display panel further includes a hole barrier layer, an electron transport layer and an electron injection layer. Therefore, the display effect can be further improved.

According to an embodiment of the present application, the light-emitting functional layer is a hole injection layer, a hole transport layer, an electron barrier layer, an organic light-emitting layer and a hole barrier layer; and the organic light-emitting display panel further includes an electron transport layer and an electron injection layer. Therefore, the display effect can be further improved.

In yet another aspect of the present application, the present application provides a display device including a display panel, wherein the display panel is an organic light-emitting display panel described above or obtained by the method for preparing an organic light-emitting display panel described above. Therefore, the display device has all the features and advantages of the display panel described above, and will not be repeated here.

BRIEF DESCRIPTION OF DRAWINGS

The above mentioned and/or additional aspects and advantages of the present application will become apparent and easy to understand from the following description of embodiments in conjunction with accompanying drawings.

FIG. 4 shows a partial flowchart for preparing an organic light-emitting display panel according to the present application.

Figure 1:
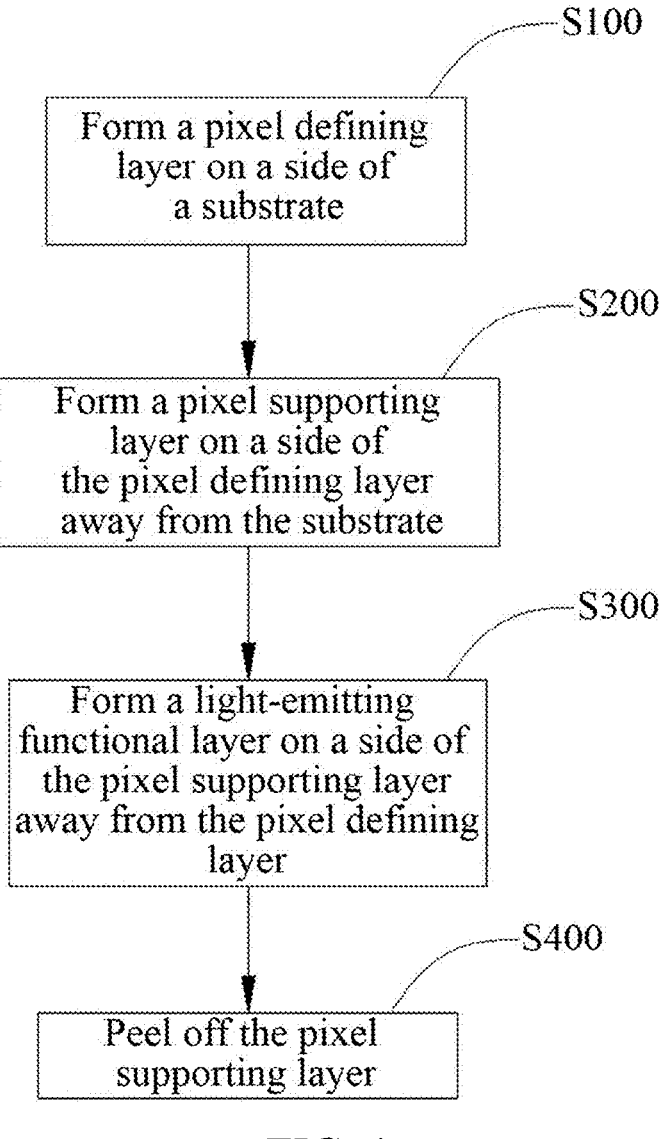
FIG. 1 shows a flowchart for preparing an organic light-emitting display panel according to the present application.

Description of reference signs: 100: Substrate; 200: Pixel defining layer; 300: Pixel supporting layer; 310: Foreign body; 320: Inorganic layer; 330: Inorganic layer gap; 400: Light-emitting functional layer; 500: Common layer; 10: Surrounding portion; 20: First connecting portion; 30: Second connecting portion.

DETAILED DESCRIPTION

Descriptions will be made in detail to embodiments of the present application, illustrations of which are shown in the accompanying drawings. The same or similar elements, or elements having same or similar function are indicated by same or similar reference numerals throughout the descriptions. The embodiments described herein with reference to the accompanying drawings are exemplary, used for explaining the present application only, and should not be construed to limit the present application.

The present application is intended to solve one of the technical problems in the related art to some extent.

In one aspect of the present application, the present application provides a method for preparing an organic light-emitting display panel, including: forming a pixel defining layer on a side of a substrate; forming a pixel supporting layer (Photo Spacer, PS) on a side of the pixel defining layer away from the substrate, wherein an orthographic projection of a surface of a side of the pixel supporting layer that faces the pixel defining layer on the substrate is within a range of an orthographic projection of a surface of a side of the pixel supporting layer away from the pixel defining layer on the substrate; forming a light-emitting functional layer on the side of the pixel supporting layer away from the pixel defining layer; and peeling off the pixel supporting layer to obtain an organic light-emitting display panel. Thereby, an evaporation film layer can be protected by providing the pixel supporting layer, and damage to the evaporation film layer can be effectively reduced by peeling off the pixel supporting layer, and at the same time, a disconnection slit is formed on the light-emitting functional layer.

Figure 3:
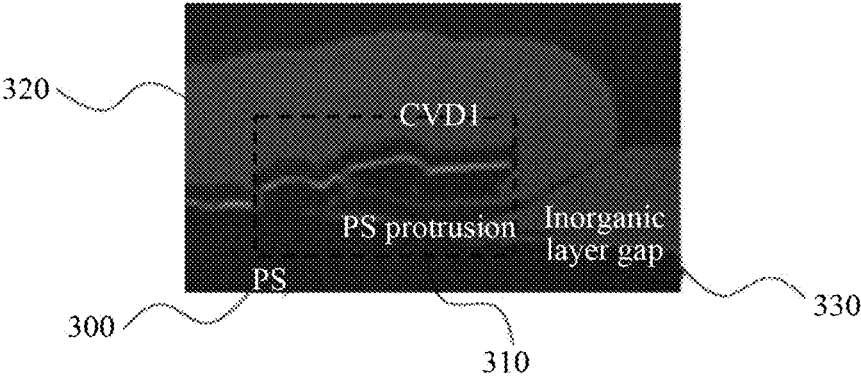
FIG. 3 shows a scanning electron microscope diagram of a defect in an encapsulation layer in the related art.
Figure 6:
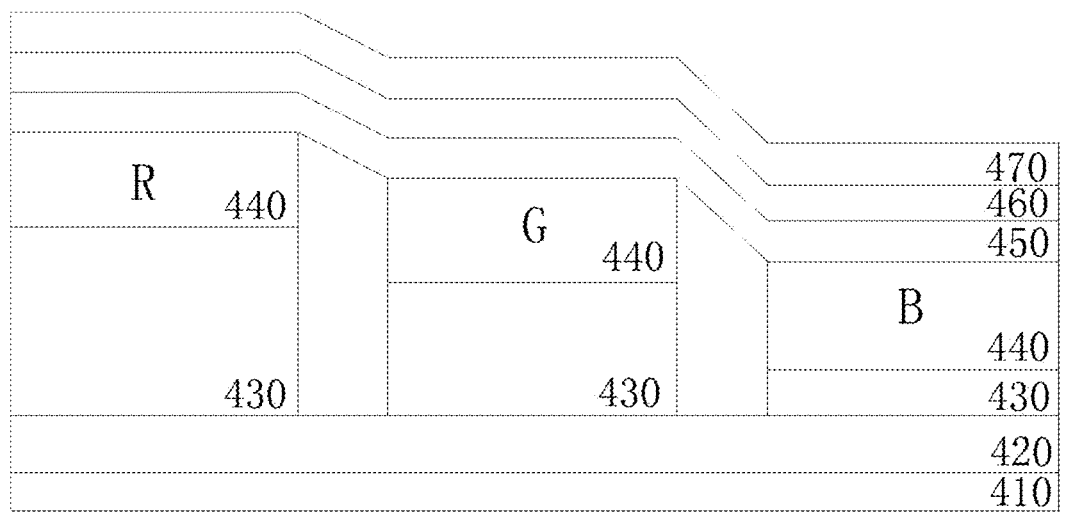
FIG. 6 shows a partial schematic structural diagram of an organic light-emitting display panel according to an embodiment of the present application.

For convenience of understanding, referring to FIGS. 3 and 6, the principle that the method for preparing the organic light-emitting display panel can achieve the above beneficial effects is briefly explained below.

In an OLED device, when a switch-on voltage is applied to a sub-pixel unit of a certain color, electrons are injected into an electron injection layer 470 from a cathode and holes flow into a hole injection layer 410 from an anode. Electrons and holes flow to an organic light-emitting layers 440 of corresponding colors through an electron transport layer 460 and a hole transport layer 420 matched with carrier transport rates, respectively, and are coupled in the organic light-emitting layers 440 to form excitons, of which radiative transition causes to emit photons and release energy. In order to prevent further migration of electrons and holes after the electrons and holes reach the organic light-emitting layers 440 due to the action of the electric field, an electron barrier layer 430 and a hole barrier layer 450 are provided. By using special energy level structures of the electron barrier layer and the hole barrier layer, a migration barrier may be formed for electrons and holes to prevent further migration away from the organic light-emitting layers 440. For the emitting-on voltage of RGB pixel units, usually B (blue sub-pixel) has the maximum voltage, the voltage of G (green sub-pixel) and the voltage of R (red sub-pixel) are small. Since the light-emitting functional layers are mostly formed by evaporation of the whole layer, the commonly used RGB organic light-emitting diodes share a hole injection layer 410 and a hole transport layer 420, that is, there is also a light-emitting functional layer material between a plurality of organic light-emitting diodes of the display substrate. Generally, the hole injection layer has a larger carrier mobility. For example, when a large voltage is applied across the blue sub-pixel unit, most of the current will flow to the organic light-emitting layer of the blue sub-pixel, and light up the blue sub-pixel, but a small amount of current will flow to the organic light-emitting layer of the green sub-pixel and the organic light-emitting layer of the red sub-pixel through the common hole injection layer, respectively, and light up the green pixel and the red pixel, which will eventually lead to the low gray-scale display and occurring of color crosstalk, and as a result, the low gray-scale display quality of the display panel is poor. According to the method of the present application, an inverted trapezoidal pixel supporting layer is formed on the pixel defining layer, so that when the light-emitting layer is formed, the material of the light-emitting layer is disconnected at an inverted trapezoidal pixel supporting layer to avoid forming a continuous film layer of light-emitting functional layer, and then the pixel supporting layer is peeled off after the hole injection layer is formed. Therefore, the material of the light-emitting functional layer above the pixel supporting layer may be removed while the pixel supporting layer is peeled off, thereby forming a gap of the light-emitting layer among a plurality of light emitting diodes, effectively cutting off a transverse transmission path of the carriers, preventing low gray scale crosstalk, and improving the low gray scale display quality of the display panel. Moreover, when there is no pixel supporting layer, the mask is easily torn when separated from the substrate, which leads to the increase of process cost and process flows. When there is a pixel supporting layer 300, after a surface of the pixel supporting layer 300 is damaged, the pixel supporting layer material falling off due to the damage will form a foreign body 310 on the surface of the light-emitting functional layer. Due to the existence of the foreign body 310, an inorganic layer gap 330 appears in an inorganic layer 320 in an encapsulation structure, which eventually leads to encapsulation failure, and the display panel appears as a region with a defect of multiple dark spots. Therefore, by providing a pixel supporting layer on the substrate to support the mask before the light-emitting functional layer is evaporated, the mask may be effectively prevented from scratching the evaporated film layer, and at the same time the mask may be prevented from being damaged due to too tight attachment to the substrate. In addition, by peeling off the mask before the encapsulation process, damage to the inorganic layer of the encapsulation structure due to the damage of the mask can be effectively reduced, and a disconnection slit is formed on the light-emitting functional layer to further improve the display effect.

Specifically, referring to FIG. 1, the method may include the following acts.

7

In S100, a pixel defining layer is formed on a side of a substrate.

Figure 2:
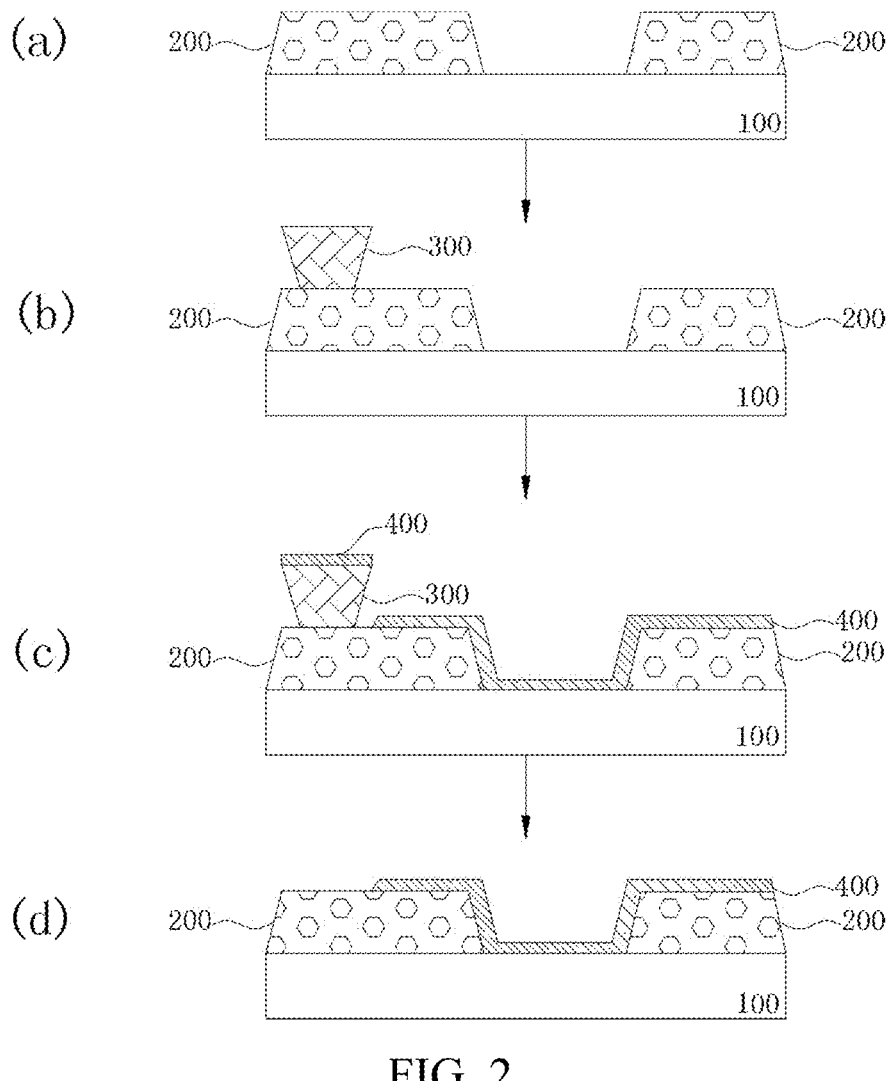
FIG. 2 shows a flowchart for preparing an organic light-emitting display panel according to the present application.

According to some embodiments of the present application, referring to (a) in FIG. 2, a pixel defining layer 200 is formed on a side of the substrate 100 in this act, and the pixel defining layer may define and distinguish sub-pixel areas on the substrate, which is convenient for accurate positioning of sub-pixel areas in subsequent processes. The structure of the pixel defining layer is not particularly limited, specifically as long as the pixel defining layer may define a plurality of sub-pixels including a red sub-pixel, a blue sub-pixel and a green sub-pixel on the substrate.

In S200, a pixel supporting layer is formed on a side of the pixel defining layer away from the substrate.

According to some embodiments of the present application, referring to (b) in FIG. 2, a pixel supporting layer 300 is formed on a side of the pixel defining layer 200 away from the substrate 100 in this act. The pixel supporting layer plays a role of supporting a mask to avoid direct contact between the mask and the evaporation film layer in an evaporation process, thereby avoiding affecting the evaporation effect. Therefore, the pixel supporting layer is provided to reduce damage to the film layer by the mask. The structure of the pixel supporting layer is not particularly limited, for example, an orthographic projection of the pixel supporting layer on the substrate at least surrounds an area where the red sub-pixel is located. Specifically, the orthographic projection of the pixel supporting layer on the substrate may separate areas where the red sub-pixel, the green sub-pixel, and the blue sub-pixel are located from one another on the premise of surrounding the area where the red sub-pixel is located.

According to an embodiment of the present application, a material for forming the pixel supporting layer is not particularly limited, for example, the pixel supporting layer may be formed of a negative photosensitive material, in particular, the negative photosensitive material includes a fluoroether material.

According to some embodiments of the present application, a thickness of the pixel supporting layer is not particularly limited, and in particular the thickness of the pixel supporting layer may range from 1 to 2 microns. When the thickness of the pixel supporting layer is less than 1 micron, the pixel supporting layer is too thin and has poor bearing capacity, which may not play the role of supporting the mask. When the thickness of the pixel supporting layer is greater than 2 microns, the pixel supporting layer is thicker, and in the subsequent process of peeling off the pixel supporting layer, the peeling is slow and time-consuming, which affects the preparation process.

According to some embodiments of the present application, a width of the pixel supporting layer is not particularly limited, for example, the width of the pixel supporting layer may be less than the width of a gap between two adjacent sub-pixels. Specifically, the width of the pixel supporting layer may range from 2 to 20 microns. When the width of the pixel supporting layer is less than 2 microns, the pixel supporting layer is too narrow, and the pressure per unit area is too large to support the mask. When the width of the pixel supporting layer is greater than 20 microns, an orthographic projection of the pixel supporting layer on the substrate overlaps with an orthographic projection of the sub-pixel area defined by the pixel defining layer on the substrate. When the evaporation process of the light-emitting functional layer is carried out, part of the sub-pixel areas is blocked by the pixel supporting layer, so that a complete light-emitting functional layer cannot be formed in the sub-pixel areas, which greatly affects the display effect.

In S300, a light-emitting functional layer is formed on a side of the pixel supporting layer away from the pixel defining layer.

According to some embodiments of the present application, with reference to (c) in FIG. 2, a light-emitting functional layer 400 is formed on a side of the pixel supporting layer 300 away from the pixel defining layer 200 in this act. Driven by an external voltage, electrons and holes injected by electrodes recombine in the organic light-emitting layer to form electron-hole pairs at bound energy level, i.e., excitons, which emit photons by radiative deexcitation and produce visible light. Therefore, the general light-emitting functional layer includes a series of light-emitting functional structures, which is helpful to improve the light-emitting performance of OLED devices. The light-emitting functional layer is usually formed by the evaporation process. The evaporation process has vertical selectivity. When an evaporated surface has an inverted trapezoidal structure, the light-emitting functional layer formed by evaporation will form a section difference with the surrounding plane at the inverted trapezoidal structure, so that the light-emitting functional layer is disconnected from the surrounding plane at the inverted trapezoidal structure. When the inverted trapezoidal structure and the light-emitting functional layer on the surface of the inverted trapezoidal structure are removed, the light-emitting functional layer is disconnected at the inverted trapezoidal structure.

In S400, the pixel supporting layer is peeled off.

The pixel supporting layer of the inverted trapezoidal structure and the light-emitting functional layer on the surface of the pixel supporting layer may be removed together after peeling, thereby a disconnection slit of the light-emitting functional layer is formed, thereby preventing the problem of low gray scale crosstalk.

According to some embodiments of the present application, referring to (d) of FIG. 2, after the evaporation process is completed, the pixel supporting layer no longer has a supporting effect, at this time the pixel supporting layer may be removed. In order to reduce the damage to the encapsulation structure due to the damage of the pixel supporting layer, and also to form the disconnection slit of the light-emitting functional layer around the sub-pixels to cut off the transverse transmission of holes between the sub-pixels and improve the panel display effect, in this act, the pixel supporting layer is peeled off. The peeling of the pixel supporting layer is not particularly limited. For example, a substrate including a pixel defining layer, a pixel supporting layer and a light-emitting functional layer is placed in a peeling liquid, the pixel supporting layer will gradually dissolve in the peeling liquid and then fall off. At this time, the light-emitting functional layer formed on the pixel supporting layer will also be separated from the substrate, thus forming a disconnection slit of the light-emitting functional layer. According to some embodiments of the present application, a material for forming the peeling liquid is not particularly limited, for example, the material for forming the peeling liquid may include a fluoroether material.

According to some embodiments of the present application, with reference to FIG. 4, the specific structure included in the light-emitting functional layer is not particularly limited. For example, it may include a hole injection layer and one or more of a hole transport layer, an electron barrier layer, an organic light-emitting layer, a hole barrier layer, an electron injection layer and an electron transport layer. As described above, in the present application, a disconnection slit is formed at the light-emitting functional layer by peeling off the pixel supporting layer, thereby preventing the problem of low gray scale crosstalk. Therefore, the light-emitting functional layer may be one or several layers with the highest carrier mobility among a plurality of organic film layers of the organic light-emitting diode. For example, the disconnection slit may be formed in at least the hole injection layer. Alternatively, the disconnection slit may be formed in the hole injection layer and the hole transport layer.

For example, according to some embodiments of the present application, the light-emitting functional layer may be a hole injection layer, a hole transport layer, an electron barrier layer, an organic light-emitting layer, a hole barrier layer and an electron transport layer. The method may include: In S310, a hole injection layer is formed on a side of the pixel supporting layer away from the pixel defining layer.

According to some embodiments of the present application, a hole injection layer is formed on a side of the pixel supporting layer away from the pixel defining layer in this act. Thus, holes are injected into the hole injection layer from an anode under the action of an applied electric field.

In S320, a hole transport layer is formed on a side of the hole injection layer away from the pixel supporting layer.

According to some embodiments of the present application, a hole transport layer is formed on a side of the hole injection layer away from the pixel supporting layer in this act. Thus, holes in the hole injection layer migrate to the organic light-emitting layer through the hole transport layer.

In S330, an electron barrier layer is formed on a side of the hole transport layer away from the hole injection layer.

According to some embodiments of the present application, an electron barrier layer is formed on a side of the hole transport layer away from the hole injection layer in this act. Therefore, when electrons migrate into the organic light-emitting layer, electrons may continue to migrate to the anode due to the existence of the electric field, resulting in a decrease in electron concentration and a decrease in light-emitting efficiency of the organic light-emitting layer. Because of the special energy level structure of the electron barrier layer, it may form a migration barrier for electrons and prevent them from further migration.

In S340, an organic light-emitting layer is formed on a side of the electron barrier layer away from the hole transport layer.

According to some embodiments of the present application, an organic light-emitting layer is formed on a side of the electron barrier layer away from the hole transport layer in this act. Since electrons and holes need to be transported in the light-emitting layer, a material forming the organic light-emitting layer needs to have the characteristics of strong fluorescence in a solid state, good electron and hole transport performance, good thermal and chemical stability, high quantum efficiency and capability of vacuum evaporation.

In S350, a hole barrier layer is formed on a side of the organic light-emitting layer away from the electron barrier layer.

According to some embodiments of the present application, a hole barrier layer is formed on a side of the organic light-emitting layer away from the electron barrier layer in this act. Therefore, after migrating into the organic light-emitting layer, the holes may continue to migrate to the cathode due to the existence of the electric field, resulting in a decrease in hole concentration in the light-emitting region and a decrease in light-emitting efficiency. The hole barrier layer, because of its special energy level structure, may form a migration barrier for holes and prevent them from further migration.

In S360, an electron transport layer is formed on a side of the hole barrier layer away from the organic light-emitting layer.

According to some embodiments of the present application, an electron transport layer is formed on a side of the hole barrier layer away from the organic light-emitting layer in this act. Thus, electrons of the electron injection layer migrate to the organic light-emitting layer through the electron transport layer.

Then, the operation of peeling off the pixel supporting layer may be performed, thereby the hole injection layer, the hole transport layer, the electron barrier layer, the organic light-emitting layer, the hole barrier layer and the electron transport layer that are formed above may be peeled off along with the pixel supporting layer, thereby forming a disconnection slit. Subsequently, the following operation may also be performed: In S370: an electron injection layer is formed on a side of the electron transport layer away from the hole barrier layer.

According to an embodiment of the present application, an electron injection layer is formed on a side of the electron transport layer away from the hole barrier layer in this act. Thereby, electrons are injected into the electron injection layer from the cathode under the action of an applied electric field.

Alternatively, the light-emitting functional layer may be a hole injection layer, a hole transport layer, an electron barrier layer, an organic light-emitting layer and a hole barrier layer, that is, a peeling operation may be performed after the hole injection layer, the hole transport layer, the electron barrier layer, the organic light-emitting layer and the hole barrier layer are formed, thereby forming a disconnection slit. Then, an electron transport layer and an electron injection layer are formed.

Alternatively, the light-emitting functional layer may be a hole injection layer, a hole transport layer, an electron barrier layer, and an organic light-emitting layer, that is, a peeling operation may be performed after the hole injection layer, the hole transport layer, the electron barrier layer, and the organic light-emitting layer are formed, thereby forming a disconnection slit. Subsequently, a hole barrier layer, an electron transport layer and an electron injection layer are formed.

In addition, the light-emitting functional layer may also be a hole injection layer and a hole transport layer, that is, a peeling operation may be performed after the hole injection layer and the hole transport layer are formed, thereby forming a disconnection slit. Subsequently, an electron barrier layer, an organic light-emitting layer, a hole barrier layer, an electron transport layer and an electron injection layer are formed.

It will be understood by those skilled in the art that the part of the structure of the light-emitting functional layer, formed before the pixel supporting layer is peeled off, will form a disconnection slit at a corresponding position of the pixel supporting layer as the pixel supporting layer is peeled off. The part of the structure of the light-emitting functional layer, formed after the pixel supporting layer is peeled off, has no disconnection slit at the corresponding position of the pixel supporting layer. The part of the structure of the light-emitting functional layer, formed before the pixel supporting layer is peeled off, is not particularly limited, and only needs to include a hole injection layer and a hole transport layer, those skilled in the art may make a choice according to the actual situation.

Figure 5:
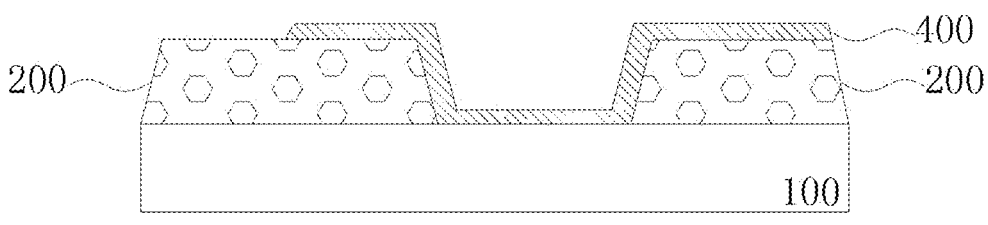
FIG. 5 shows a schematic structural diagram of an organic light-emitting display panel according to an embodiment of the present application.

In another aspect of the present application, an organic light-emitting display panel is provided in the present application. Referring to FIG. 5, the organic light-emitting display panel includes: a substrate 100; a pixel defining layer 200 defining a plurality of sub-pixels on the substrate; a light-emitting functional layer 400 located on one side of the pixel defining layer away from the substrate; wherein the light-emitting functional layer is provided with a disconnection slit at a gap between two adjacent sub-pixels. The disconnection slit between two adjacent sub-pixels in the light-emitting functional layer may effectively cut off the transverse transmission of holes between adjacent sub-pixels, thus improving the color crosstalk between sub-pixels and significantly improving the low gray scale display quality of the panel. The organic light-emitting display panel may be prepared using the method described above. Thus, the organic light-emitting display panel may have all the features and advantages of the display panel obtained by the aforementioned method, which will not be described here.

According to some embodiments of the present application, sub-pixel types are not particularly limited, for example, the sub-pixels may include a red sub-pixel, a green sub-pixel and a blue sub-pixel.

Figure 7:
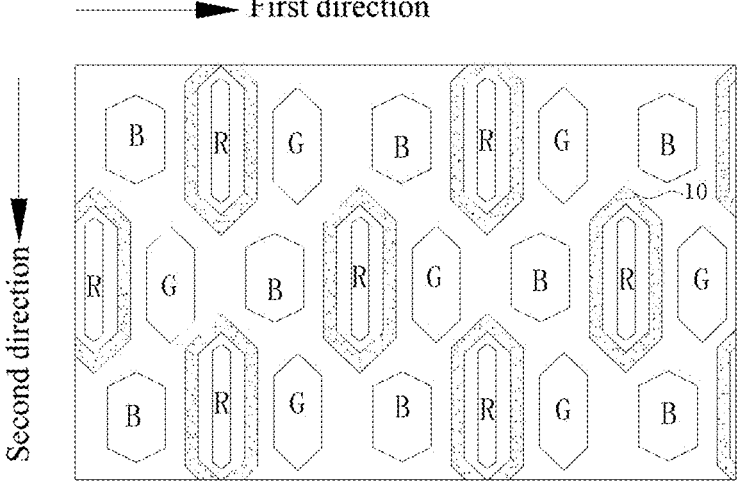
FIG. 7 shows another partial schematic structural diagram of an organic light-emitting display panel according to another embodiment of the present application.

According to some embodiments of the present application, referring to FIG. 7, the red sub-pixel is more prone to low gray scale color crosstalk since the emitting-on voltage of R (red sub-pixel) is low. The area surrounded by an orthographic projection of the disconnection slit on the substrate is not particularly limited. Specifically, a surrounding portion 10 of the orthographic projection of the disconnection slit on the substrate may surround an area where the red sub-pixel is located.

Figure 8:
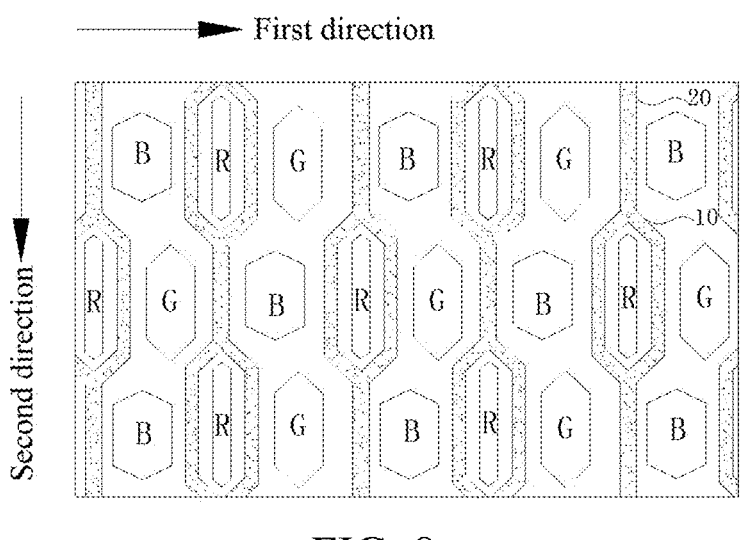
FIG. 8 shows still another partial schematic structural diagram of an organic light-emitting display panel according to yet another embodiment of the present application.

According to an embodiment of the present application, referring to FIG. 8, the orthographic projection of the disconnection slit on the substrate has a surrounding portion 10 and a first connecting portion 20, wherein a direction of the first connecting portion 20 is the same as a first direction, the surrounding portion 10 surrounds an area where R (red sub-pixel) is located, and the first connecting portion 20 connects two adjacent surrounding portions 10 and separates G (green sub-pixel) and B (blue sub-pixel) that are located in the first direction and adjacent. Therefore, low gray scale crosstalk between adjacent red sub-pixels and between partial blue and green sub-pixels may be effectively reduced. The plurality of sub-pixels are arranged in the first direction and a second direction, for example, in a plurality of rows in the first direction and in a plurality of columns in the second direction. It may be understood by those skilled in the art that the first direction and the second direction may not be completely perpendicular, and may have an included angle which may not be 90 degrees.

Figure 9:
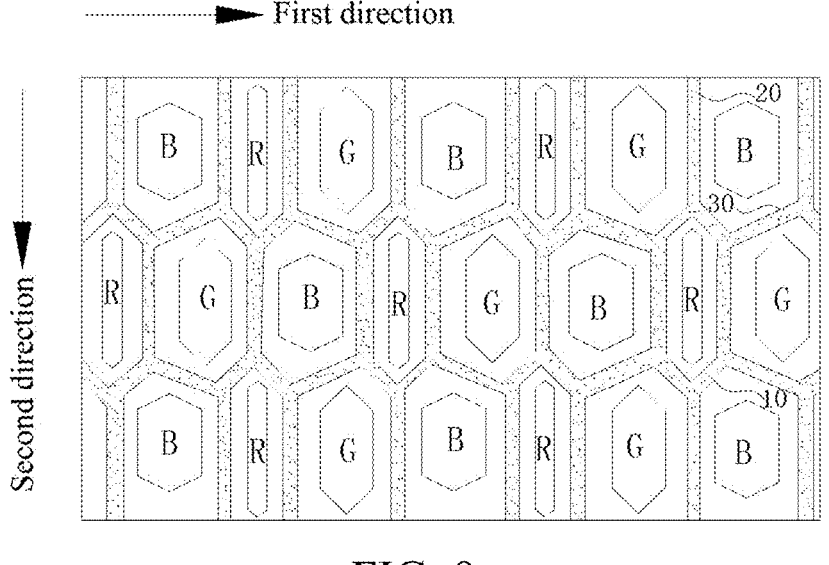
FIG. 9 shows yet still another partial schematic structural diagram of an organic light-emitting display panel according to yet another embodiment of the present application.

According to an embodiment of the present application, referring to FIG. 9, the orthographic projection of the disconnection slit on the substrate has a surrounding portion 10, a first connecting portion 20 and a second connecting portion 30. The surrounding portion 10 surrounds an area where R (red sub-pixel) is located. The first connecting portion 20 connects two adjacent surrounding portions 10 in the first direction. The first connecting portion 20 separates areas where G (green sub-pixel) and B (blue sub-pixel) are located in the second direction. The second connecting portion 30 connects two adjacent surrounding portions 10 in the second direction, and the second connecting portion 20 separates areas where green sub-pixel and blue sub-pixel are located in the first direction. Therefore, the low gray scale crosstalk between adjacent sub-pixels can be further effectively reduced.

The organic light-emitting diode is prepared by the method described above, and thus may have a structure consistent with the organic light-emitting diode obtained by the method described above. Specifically, the disconnection slit may be formed between the electron transport layer and the electron injection layer, that is, the light-emitting functional layer may be a hole injection layer, a hole transport layer, an electron barrier layer, an organic light-emitting layer, a hole barrier layer and an electron transport layer.

Alternatively, the disconnection slit may be formed between the hole barrier layer and the electron transport layer, that is, the light-emitting functional layer may be a hole injection layer, a hole transport layer, an electron barrier layer, an organic light-emitting layer and a hole barrier layer.

Alternatively, the disconnection slit may be formed between the organic light-emitting layer and the hole barrier layer, that is, the light-emitting functional layer may be a hole injection layer, a hole transport layer, an electron barrier layer and an organic light-emitting layer.

In addition, the disconnection slit may be formed between the hole transport layer and the electron barrier layer, that is, the light-emitting functional layer may be a hole injection layer and a hole transport layer.

According to an embodiment of the present application, the composition of the light-emitting functional layer is not particularly limited, as long as it includes a hole injection layer and a hole transport layer. For example, when the light-emitting functional layer is a hole injection layer, a hole transport layer, an electron barrier layer, an organic light-emitting layer, a hole barrier layer and an electron transport layer, the organic light-emitting display panel further includes an electron injection layer. For example, when the light-emitting functional layer is a hole injection layer and a hole transport layer, the organic light-emitting display panel further includes an electron barrier layer, an organic light-emitting layer, a hole barrier layer, an electron transport layer and an electron injection layer. Specifically, when the light-emitting functional layer is a hole injection layer, a hole transport layer, an electron barrier layer, and an organic light-emitting layer, the organic light-emitting display panel may further include a hole barrier layer, an electron transport layer, and an electron injection layer. For example, when the light-emitting functional layer is a hole injection layer, a hole transport layer, an electron barrier layer, an organic light-emitting layer and a hole barrier layer, the organic light-emitting display panel further includes an electron transport layer and an electron injection layer.

Figure 10:
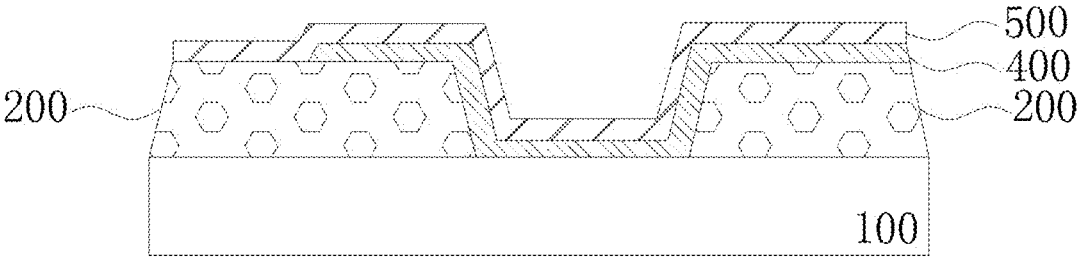
FIG. 10 shows another schematic structural diagram of an organic light-emitting display panel according to yet another embodiment of the present application.

As will be understood by those skilled in that art, referring to FIG. 10, the light-emitting functional layer 400 forming a disconnection slit on the pixel defining layer 200 only needs to include a hole injection layer and a hole transport layer. In a specific implementation, other common light-emitting functional structures not included in the light-emitting functional layer 400, such as an electron barrier layer, an organic light-emitting layer, a hole barrier layer, an electron transport layer, an electron input layer and the like, may be included in the common layer 500. Those skilled in that art may make a choice according to the actual situation.

In yet another aspect of the present application, the present application provides a display device including a display panel, wherein the display panel is an organic light-emitting display panel described above or obtained by the method for preparing an organic light-emitting display panel described above. Therefore, the display device has all the features and advantages of the display panel described above, and will not be repeated here.

The solution of the present application will be described below through specific embodiments. It should be noted that the following embodiments are intended to illustrate the present application only, and should not be taken as limiting the scope of the present application. The embodiments in which specific technologies or conditions are not indicated shall be carried out according to technologies or conditions described in literatures in the art or according to a product specification. If the manufacturer is not indicated, the reagents or instruments used are conventional products that may be obtained through commercial purchase.

Embodiment 1

1. A backplane circuit, an anode and a pixel defining layer are formed on a substrate. Specifically, it may include: PI/Buffer/Active/GI1/Gate1/GI2/Gate2/ILD/SD/PLN/ Anode/PDL (PI: Polyimide; Buffer: buffer layer; Active: activation layer; GI1: insulating layer 1; Gate1: gate 1; GI2: insulating layer 2; Gate2: gate 2; ILD: Inter Layer Dielectric; SD: source and drain; PLN: interlayer planarization layer; Anode: anode; PDL: Pixel Define Layer).
2. A fluoroether material with a thickness of 2 microns and a width of 10 microns is coated on the film layer. After exposure and development are performed, an inverted trapezoidal pixel supporting layer is obtained, and the pixel supporting layer surrounds the red sub-pixel area.
3. On the backplane structure, a common evaporation process is adopted to form a light-emitting functional layer: a hole injection layer, a hole transport layer, an electron barrier layer, an organic light-emitting layer, a hole barrier layer and an electron transport layer.
4. After the evaporation of the organic film layer is finished, the device is taken out from the evaporation cavity, transferred to the nitrogen box, and placed in the flurane peeling liquid.
5. The device is taken out from the nitrogen box and transferred to the evaporation cavity to complete evaporation of the electron injection layer and the conventional device structure.
6. The subsequent encapsulation and module process are completed according to the conventional process.

The results show that the red sub-pixel is separated from the blue sub-pixel and the green sub-pixel, and the transverse transmission of carriers is cut off. There is no low gray scale crosstalk on the display panel, and the display effect is good.

Embodiment 2

1. A backplane circuit, an anode and a pixel defining layer are formed on a substrate. Specifically, it may include: PI/Buffer/Active/GI1/Gate1/GI2/Gate2/ILD/SD/PLN/An- ode/PDL (PI: Polyimide; Buffer: buffer layer; Active: activation layer; GI1: insulating layer 1; Gate1: gate 1; GI2: insulating layer 2; Gate2: gate 2; ILD: Inter Layer Dielectric; SD: source and drain; PLN: interlayer planarization layer; Anode: anode; PDL: Pixel Define Layer).
2. A fluoroether material with a thickness of 2 microns and a width of 10 microns is coated on the film layer. After exposure and development are performed, an inverted trapezoidal pixel supporting layer is obtained, and the pixel supporting layer surrounds the red sub-pixel area, the blue sub-pixel area and the green sub-pixel area.

3. On the backplane structure, a common evaporation process is adopted to form a light-emitting functional layer, i.e., a hole injection layer, a hole transport layer, an electron barrier layer, an organic light-emitting layer, a hole barrier layer and an electron transport layer.
4. After the evaporation of the organic film layer is finished, the device is taken out from the evaporation cavity, transferred to the nitrogen box, and placed in the flurane peeling liquid.
5. The device is taken out from the nitrogen box and transferred to the evaporation cavity to complete evaporation of the electron injection layer and the conventional device structure.
6. The subsequent encapsulation and module process are completed in the conventional process.

The results show that the red sub-pixel, blue sub-pixel and green sub-pixel are all separated from one another, and the transverse transmission of carriers is cut off. There is no low gray scale crosstalk on the display panel, and the display effect is good.

Comparative Example 1

1. A backplane circuit, an anode and a pixel defining layer are formed on a substrate. Specifically, it may include: PI/Buffer/Active/GI1/Gate1/GI2/Gate2/ILD/SD/PLN/ Anode/PDL (PI: Polyimide; Buffer: buffer layer; Active: activation layer; GI1: insulating layer 1; Gate1: gate 1; GI2: insulating layer 2; Gate2: gate 2; ILD: Inter Layer Dielectric; SD: source and drain; PLN: interlayer planarization layer; Anode: anode; PDL: Pixel Define Layer).
2. On the backplane structure, a light-emitting functional layer, i.e., a hole injection layer, a hole transport layer, an electron barrier layer, an organic light-emitting layer, a hole barrier layer, an electron transport layer and an electron injection layer, is formed by evapora- tion.
3. On the backplane structure, the rest of the conventional device structure is completed by evaporation in the evaporation cavity.
4. The subsequent encapsulation and module process are completed according to the conventional process.

The results show that the metal mask scratches the light-emitting functional layer when the substrate that does not include a pixel supporting layer contacts with the metal mask, which affects the normal operation of the light- emitting functional layer and cannot meet the display requirements. Electrostatic adsorption is generated because of the mask is too tightly attached to the substrate. When the mask is pulled up, the mask is torn due to excessive electrostatic adsorption force, and cannot be used again.

Comparative Example 2

1. A backplane circuit, an anode and a pixel defining layer are formed on a substrate. Specifically, it may include: PI/Buffer/Active/GI1/Gate1/GI2/Gate2/ILD/SD/PLN/ Anode/PDL (PI: Polyimide; Buffer: buffer layer; Active: activation layer; GI1: insulating layer 1; Gate1: gate 1; GI2: insulating layer 2; Gate2: gate 2; ILD: Inter Layer Dielectric; SD: source and drain; PLN: interlayer planarization layer; Anode: anode; PDL: Pixel Define Layer).
2. A fluoroether material with a thickness of 2 microns and a width of 10 microns is coated on the film layer. After exposure and development are performed, an inverted trapezoidal pixel supporting layer is obtained, and the pixel supporting layer surrounds the red sub-pixel area, the blue sub-pixel area and the green sub-pixel area.

3. On the backplane structure, a common evaporation process is adopted to form a light-emitting functional layer, i.e., a hole injection layer, a hole transport layer, an electron barrier layer, an organic light-emitting layer, a hole barrier layer, an electron transport layer, and an electron injection layer.

4. On the backplane structure, the rest of the conventional device structure is completed by evaporation in the evaporation cavity.

5. The subsequent encapsulation and module process are completed according to the conventional process.

The results show that the foreign body detached due to damage of the pixel supporting layer causes poor encapsulation of the encapsulation structure, and more dark spots appear on the display panel after reliability test, so the display performance cannot meet the requirements.

In the description of the present application, an orientation or a position relationship indicated by terms "upper", "lower", etc. is based on an orientation or a location relationship shown in the drawings, and this is only for convenience of description of the present application, but does not require that the present application must be constructed and operated in a specific orientation, and therefore this cannot be understood as a limitation on the present application.

Reference terms "an embodiment," "another embodiment," etc. throughout this specification means that a particular feature, structure, material, or characteristic described in connection with the embodiment is included in at least one embodiment of the present disclosure. In this specification, the schematic expression of the above terms does not necessarily refer to the same embodiment or example. Moreover, the specific feature, structure, material, or characteristic described may be combined in a proper way in any one or more embodiments or examples. In addition, without a conflict, a person skilled in the art may combine different embodiments or examples described in this specification and the features of different embodiments or examples.

Although the embodiments of the present application have been shown and described above, it should be understood that the above embodiments are exemplary, and will not be understood as the limitation to the present application. Alterations, modifications, substitutions and variations to the above embodiments may be made by those skilled in the art within the scope of the present application.

The invention claimed is:

1. A method for preparing an organic light-emitting display panel, comprising:

forming a pixel defining layer on a side of a substrate;

forming a pixel supporting layer on a side of the pixel defining layer away from the substrate, wherein an orthographic projection of a surface of a side of the pixel supporting layer that faces the pixel defining layer on the substrate is within a range of an orthographic projection of a surface of a side of the pixel supporting layer away from the pixel defining layer on the substrate;

forming a light-emitting functional layer on the side of the pixel supporting layer away from the pixel defining layer; and peeling off the pixel supporting layer to obtain the organic light-emitting display panel, wherein the pixel defining layer defines a plurality of sub-pixels on the substrate, wherein the light-emitting functional layer is provided with a disconnection slit at a gap between two adjacent sub-pixels of the plurality of sub-pixels, wherein the plurality of sub-pixels comprise a red sub-pixel, a green sub-pixel and a blue sub-pixel, and an orthographic projection of the disconnection slit on the substrate surrounds an area where the red sub-pixel is located, the orthographic projection of the disconnection slit on the substrate has a surrounding portion, a first connecting portion and a second connecting portion, the first connecting portion connects two surrounding portions that are adjacent in a first direction, the first connecting portion separates areas, where the green sub-pixel and the blue sub-pixel are located, in a second direction, the second connecting portion connects two surrounding portions that are adjacent in the second direction, and the second connecting portion separates areas, where the green sub-pixel and the blue sub-pixel are located, in the first direction, and all of the red sub-pixel, the green sub-pixel and the blue sub-pixel are hexagonal, the red sub-pixel, the green sub-pixel and the blue sub-pixel have different sizes from one another, the surrounding portion is hexagonal and surrounds the hexagonal red sub-pixel, and each of six sides of the hexagonal surrounding portion is parallel to a corresponding side of the hexagonal red sub-pixel, the first connecting portion is parallel to at least one side of the surrounding portion, and the second connecting portion is not parallel to any side of the surrounding portion.

2. The method according to claim 1, wherein an orthographic projection of the pixel supporting layer on the substrate at least surrounds an area where the red sub-pixel is located.

3. The method according to claim 2, wherein the orthographic projection of the pixel supporting layer on the substrate separates areas where the red sub-pixel, the green sub-pixel and the blue sub-pixel are located from one another.

4. The method according to claim 1, wherein the pixel supporting layer is formed of a negative photosensitive material comprising a fluoroether material, and the peeling off the pixel supporting layer comprises:

placing the substrate comprising the pixel defining layer, the pixel supporting layer and the light-emitting functional layer in a peeling liquid, wherein a material for forming the peeling liquid comprises a fluoroether material.

5. The method according to claim 1, wherein the light-emitting functional layer is a hole injection layer, a hole transport layer, an electron barrier layer, an organic light-emitting layer, a hole barrier layer and an electron transport layer, and after peeling off the pixel defining layer, the method further comprises:

forming an electron injection layer on a side of the electron transport layer away from the hole barrier layer.

6. The method according to claim 1, wherein the light-emitting functional layer is a hole injection layer and a hole transport layer, and after peeling off the pixel supporting layer, the method further comprises:

forming an electron barrier layer on a side of the hole transport layer away from the hole injection layer;

forming an organic light-emitting layer on a side of the electron barrier layer away from the hole transport layer;

forming a hole barrier layer on a side of the organic light-emitting layer away from the electron barrier layer;

forming an electron transport layer on a side of the hole barrier layer away from the organic light-emitting layer; and forming an electron injection layer on a side of the electron transport layer away from the hole barrier layer.

7. The method according to claim 1, wherein the light-emitting functional layer is a hole injection layer, a hole transport layer, an electron barrier layer and an organic light-emitting layer, and after peeling off the pixel defining layer, the method further comprises:

forming a hole barrier layer on a side of the organic light-emitting layer away from the electron barrier layer;

forming an electron transport layer on a side of the hole barrier layer away from the organic light-emitting layer; and forming an electron injection layer on a side of the electron transport layer away from the hole barrier layer.

8. The method according to claim 1, wherein the light-emitting functional layer is a hole injection layer, a hole transport layer, an electron barrier layer, an organic light-emitting layer and a hole barrier layer, and after peeling off the pixel defining layer, the method further comprises:

forming an electron transport layer on a side of the hole barrier layer away from the organic light-emitting layer; and forming an electron injection layer on a side of the electron transport layer away from the hole barrier layer.

9. The method according to claim 4, wherein the pixel supporting layer has a thickness of 1 to 2 microns.

10. The method according to claim 9, wherein a width of the pixel supporting layer is less than a width of a gap between two adjacent sub-pixels.

11. The method according to claim 9, wherein the pixel supporting layer has a width of 2 to 20 microns.

12. An organic light-emitting display panel, comprising:

a substrate;

a pixel defining layer, defining a plurality of sub-pixels on the substrate; and a light-emitting functional layer, located on a side of the pixel defining layer away from the substrate, wherein the light-emitting functional layer is provided with a disconnection slit at a gap between two adjacent sub-pixels, wherein the sub-pixels comprise a red sub-pixel, a green sub-pixel and a blue sub-pixel, and an orthographic projection of the disconnection slit on the substrate surrounds an area where the red sub-pixel is located, the orthographic projection of the disconnection slit on the substrate has a surrounding portion, a first connecting portion and a second connecting portion, the first connecting portion connects two surrounding portions that are adjacent in a first direction, the first connecting portion separates areas, where the green sub-pixel and the blue sub-pixel are located, in a second direction, the second connecting portion connects two surrounding portions that are adjacent in the second direction, and the second connecting portion separates areas, where the green sub-pixel and the blue sub-pixel are located, in the first direction, and all of the red sub-pixel, the green sub-pixel and the blue sub-pixel are hexagonal, the red sub-pixel, the green sub-pixel and the blue sub-pixel have different sizes from one another, the surrounding portion is hexagonal and surrounds the hexagonal red sub-pixel, and each of six sides of the hexagonal surrounding portion is parallel to a corresponding side of the hexagonal red sub-pixel, the first connecting portion is parallel to at least one side of the surrounding portion, and the second connecting portion is not parallel to any side of the surrounding portion.

13. The organic light-emitting display panel according to claim 12, wherein the light-emitting functional layer is a hole injection layer, a hole transport layer, an electron barrier layer, an organic light-emitting layer, a hole barrier layer and an electron transport layer, and the organic light-emitting display panel further comprises an electron injection layer.

14. The organic light-emitting display panel according to claim 12, wherein the light-emitting functional layer is a hole injection layer and a hole transport layer, and the organic light-emitting display panel further comprises an electron barrier layer, an organic light-emitting layer, a hole barrier layer, an electron transport layer and an electron injection layer;

or, the light-emitting functional layer is a hole injection layer, a hole transport layer, an electron barrier layer and an organic light-emitting layer, and the organic light-emitting display panel further comprises a hole barrier layer, an electron transport layer and an electron injection layer;

or, the light-emitting functional layer is a hole injection layer, a hole transport layer, an electron barrier layer, an organic light-emitting layer and a hole barrier layer, and the organic light-emitting display panel further comprises an electron transport layer and an electron injection layer.

15. A display device comprising a display panel wherein the display panel is an organic light-emitting display panel, comprising:

a substrate;

a pixel defining layer, defining a plurality of sub-pixels on the substrate; and a light-emitting functional layer, located on a side of the pixel defining layer away from the substrate, wherein the light-emitting functional layer is provided with a disconnection slit at a gap between two adjacent sub-pixels, wherein the sub-pixels comprise a red sub-pixel, a green sub-pixel and a blue sub-pixel, and an orthographic projection of the disconnection slit on the substrate surrounds an area where the red sub-pixel is located, the orthographic projection of the disconnection slit on the substrate has a surrounding portion, a first connecting portion and a second connecting portion, the first connecting portion connects two surrounding portions that are adjacent in a first direction, the first connecting portion separates areas, where the green sub-pixel and the blue sub-pixel are located, in a second direction, the second connecting portion connects two surrounding portions that are adjacent in the second direction, and the second connecting portion separates areas, where the green sub-pixel and the blue sub-pixel are located, in the first direction, and all of the red sub-pixel, the green sub-pixel and the blue sub-pixel are hexagonal, the red sub-pixel, the green sub-pixel and the blue sub-pixel have different sizes from one another, the surrounding portion is hexagonal and surrounds the hexagonal red sub-pixel, and each of 5 six sides of the hexagonal surrounding portion is parallel to a corresponding side of the hexagonal red sub-pixel, the first connecting portion is parallel to at least one side of the surrounding portion, and the second connecting portion is not parallel to any side of 10 the surrounding portion.

* * * * *